(12) United States Patent
Baker et al.

(10) Patent No.: US 6,378,966 B1
(45) Date of Patent: Apr. 30, 2002

(54) DEVICE FOR USE WITH A COMPUTER DRAWER ASSEMBLY

(75) Inventors: Bruce E. Baker, Round Rock; Philip W. Sobey, Georgetown, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/656,649

(22) Filed: Sep. 7, 2000

(51) Int. Cl.[7] .............................................. A47B 88/16
(52) U.S. Cl. ........................................ 312/333; 211/26
(58) Field of Search ............................ 312/333, 334.44, 312/334.46, 223.1, 265.1, 265.4, 323; 211/26, 189, 191; 248/220.1, 235, 250

(56) References Cited

U.S. PATENT DOCUMENTS

| | | | |
|---|---|---|---|
| 2,826,474 A | | 3/1958 | Haydu |
| 3,123,419 A | * | 3/1964 | Maxwell ..................... 312/333 |
| 3,356,432 A | * | 12/1967 | Stroud et al. ................ 312/323 |
| 4,681,381 A | * | 7/1987 | Sevey .......................... 312/333 |
| 4,979,909 A | * | 12/1990 | Andrews ................... 211/26 X |
| 5,203,620 A | | 4/1993 | McLennan ............. 312/334.46 |
| 5,810,317 A | * | 9/1998 | Macchi ................ 248/220.1 X |

FOREIGN PATENT DOCUMENTS

GB    2184345    *  6/1987    .................. 211/26

* cited by examiner

Primary Examiner—James O. Hansen
(74) Attorney, Agent, or Firm—Sawyer Law Group LLP; Mark E. McBurney

(57) ABSTRACT

A device for use with a computer drawer assembly, the computer drawer assembly including a safety latch. The device comprises a first planar portion and a second planar portion coupled to the first planar portion wherein the second planar portion retracts the safety latch during the slidable operation of the computer system. The device eliminates the tedious process of having to manually retract the safety latch with a screwdriver-type tool when using the computer drawer assembly. This adds significant convenience when a system operator needs to slidably maneuver the computer drawer assembly.

9 Claims, 7 Drawing Sheets

DEVICE FOR USE WITH A COMPUTER DRAWER ASSEMBLY

FIELD OF INVENTION

The present invention relates generally to computer drawer assemblies and more specifically to a device for use with a computer drawer assembly.

BACKGROUND OF THE INVENTION

Computer drawer assemblies are typically utilized throughout the computer industry. FIG. 1 shows a conventional drawer assembly configuration. The configuration comprises a first railing portion 10 and a second railing portion 11 directly opposite the first railing portion 10. The railing portions are coupled to a rack 12 wherein a drawer assembly 14 is slidably mounted within the railing portions 10, 11 and withdrawn as desired in order to service a computer system, check computer system parameters, etc. The drawer assembly 14 also includes a front safety latch 16 and a rear safety latch 18. The safety latches 16, 18 are designed to limit travel within the rack 12 when the drawer assembly 14 is slidably maneuvered to a front or rear service position thereby preventing the drawer assembly 14 from sliding out of the railing portions 10, 11.

However a problem arises when the drawer assembly 14 is withdrawn to either the front or rear service position. When the drawer assembly 14 is withdrawn to the rear service position, for example, the front safety latch 16 is not required but is located in the path of the rack 12. Please refer now to FIG. 2. FIG. 2 shows the withdrawn drawer assembly 14 wherein the front safety latch 16 is in the path of the rack 12. In order to retract the front safety latch 16, a system operator has to either use her fingers or a tool (screwdriver or the like) to manually retract the safety latch 16. This is a tedious and burdensome process.

Accordingly, what is needed is a device that prevents the system operator from having to either use her fingers or a tool to manually retract the safety latch. The device should be simple, cost effective and capable of being easily adapted to current technology. The present invention addresses such a need.

SUMMARY OF THE INVENTION

A device for use with a computer drawer assembly, the computer drawer assembly including a safety latch, is disclosed. The device comprises a first planar portion and a second planar portion coupled to the first planar portion wherein the second planar portion retracts the safety latch during the slidable operation of the drawer assembly.

The device in accordance with the present invention eliminates the tedious process of having to manually retract the safety latch with a screwdriver-type tool when using the computer drawer assembly. This adds significant convenience when a system operator needs to slidably maneuver the computer drawer assembly.

DETAILED DESCRIPTION OF THE INVENTION

The present invention provides a device for a computer drawer assembly. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The present invention is presented in the context of a preferred embodiment. The preferred embodiment of the present invention is a device for a computer drawer assembly. The device in accordance with the present invention eliminates the tedious process of having to manually retract the safety latch with a screwdriver-type tool when using the computer drawer assembly. This adds significant convenience when a system operator needs to slidably maneuver the computer drawer assembly.

Figure 1:
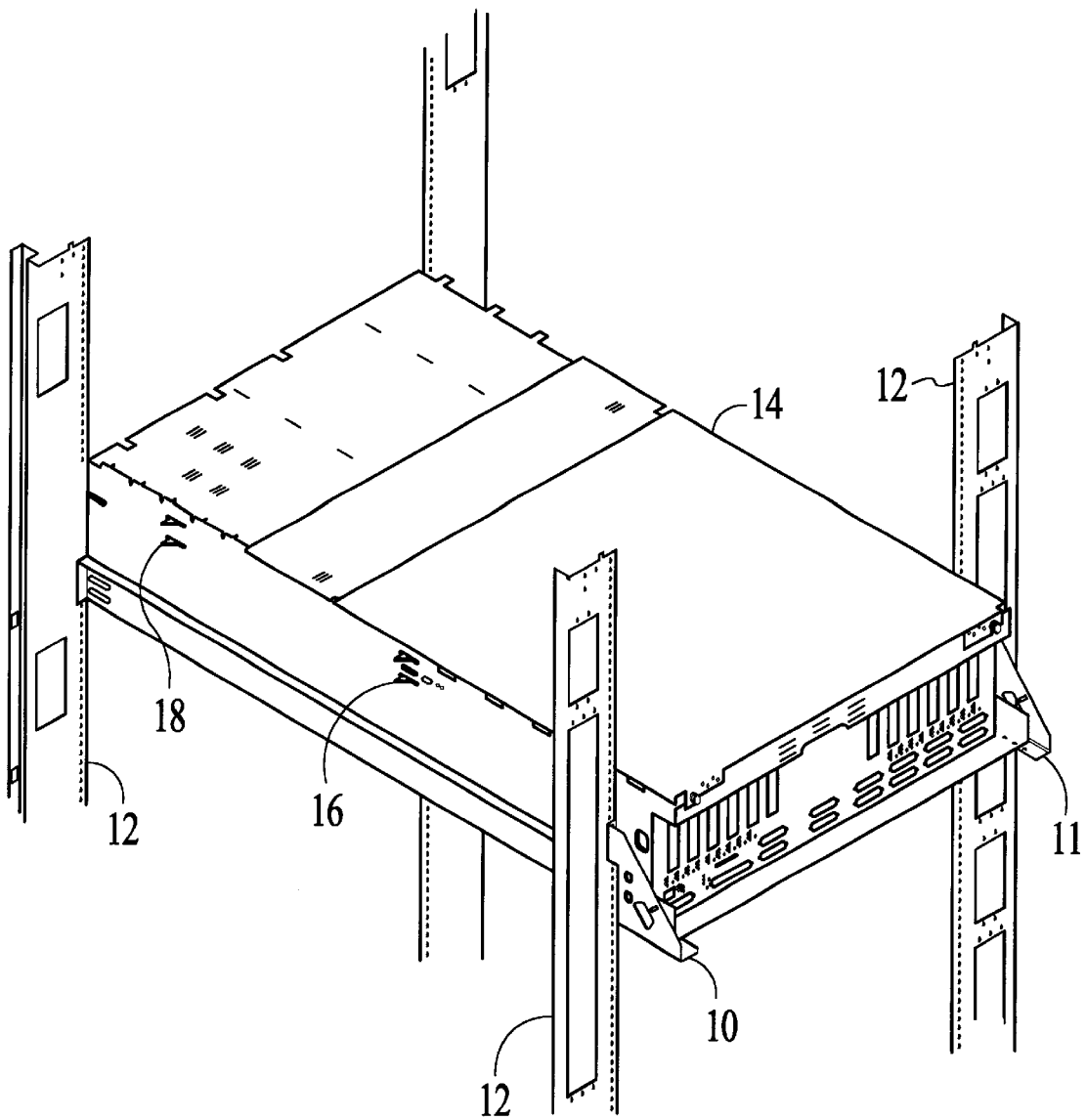
FIG. 1 shows a conventional drawer assembly configuration.
Figure 2:
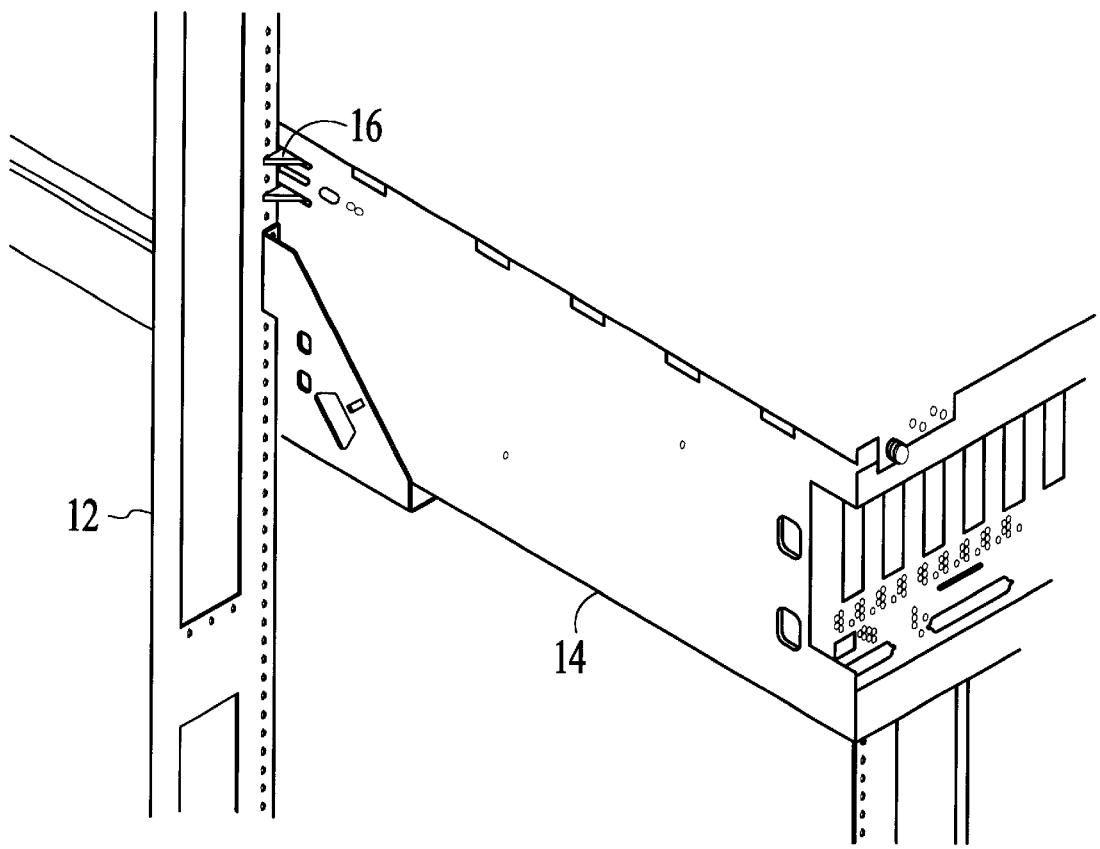
FIG. 2 shows the withdrawn drawer assembly of FIG. 1 wherein the front safety latch is in the path of the rack.
Figure 3:
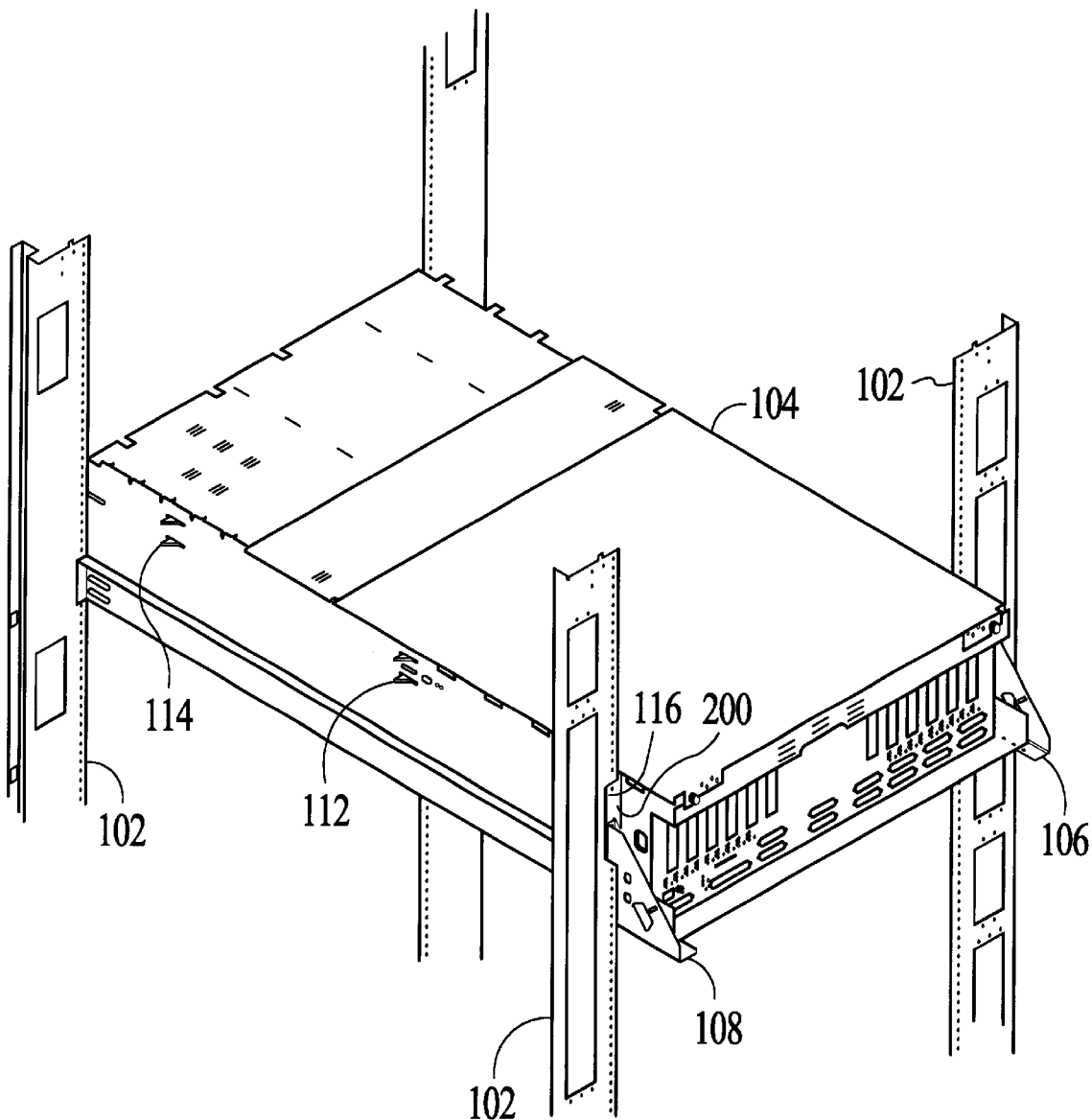
FIG. 3 shows a drawer assembly configuration in accordance with the present invention.

FIG. 3 shows a computer drawer assembly configuration 100 that incorporates a device 200 in accordance with the present invention. The configuration 100 comprises a rack 102, a drawer assembly 104, first and second railing portions 106, 108. The drawer assembly 104 is in a normal position and includes a front safety latch 112 and a rear safety latch 114. The configuration 100 also includes the device 200 in accordance with the present invention. The railing portions 106, 108 are coupled to the rack 102. The device 200 in accordance with the present invention is coupled to the rack 102 via an attachment element 116. Preferably, the attachment element 116 comprises a threaded screw or the like.

Figure 4A:
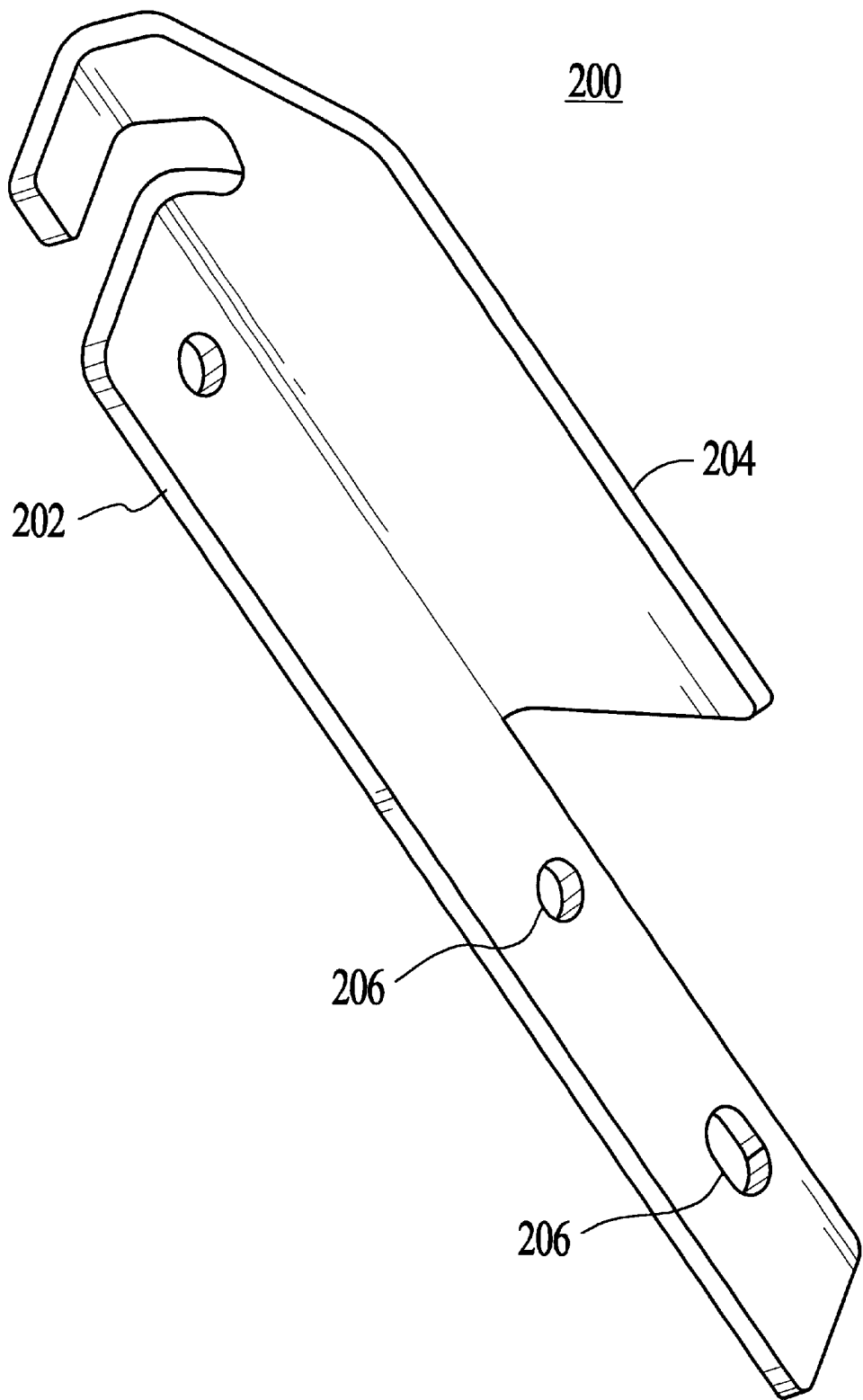
FIG. 4(a) shows a perspective view of a device in accordance with the present invention.
Figure 4B:
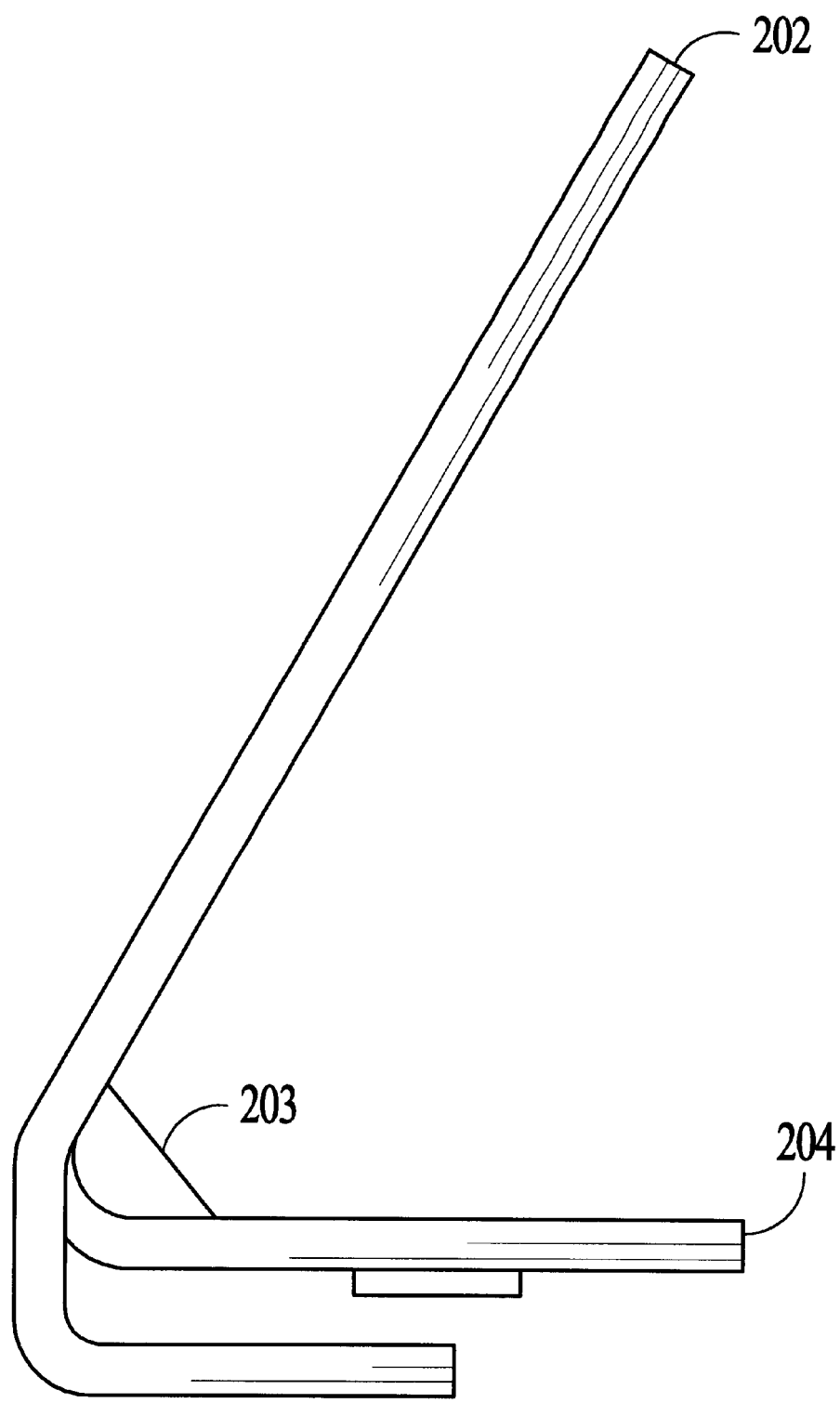
FIG. 4(b) shows a top view of the device in accordance with the present invention.

For a better understanding of the device 200 in accordance with the present invention, please refer now to FIG. 4(a). FIG. 4(a) shows a device 200 in accordance with the present invention. The device 200 comprises a first planar portion 202 and a second planar portion 204. The second planar portion 204 is coupled to a portion of the first planar portion 202 and preferably extends at a predetermined angle in relation to the first planar portion 202. FIG. 4(b) shows the second planar portion 204 extending at a predetermined angle 203 in relation to the first planar portion 202. Referring back to FIG. 4(a), the first planar portion 202 also preferably includes two openings 206 through which threaded screws or the like are utilized to couple the device 200 to the railing portion.

Figure 5:
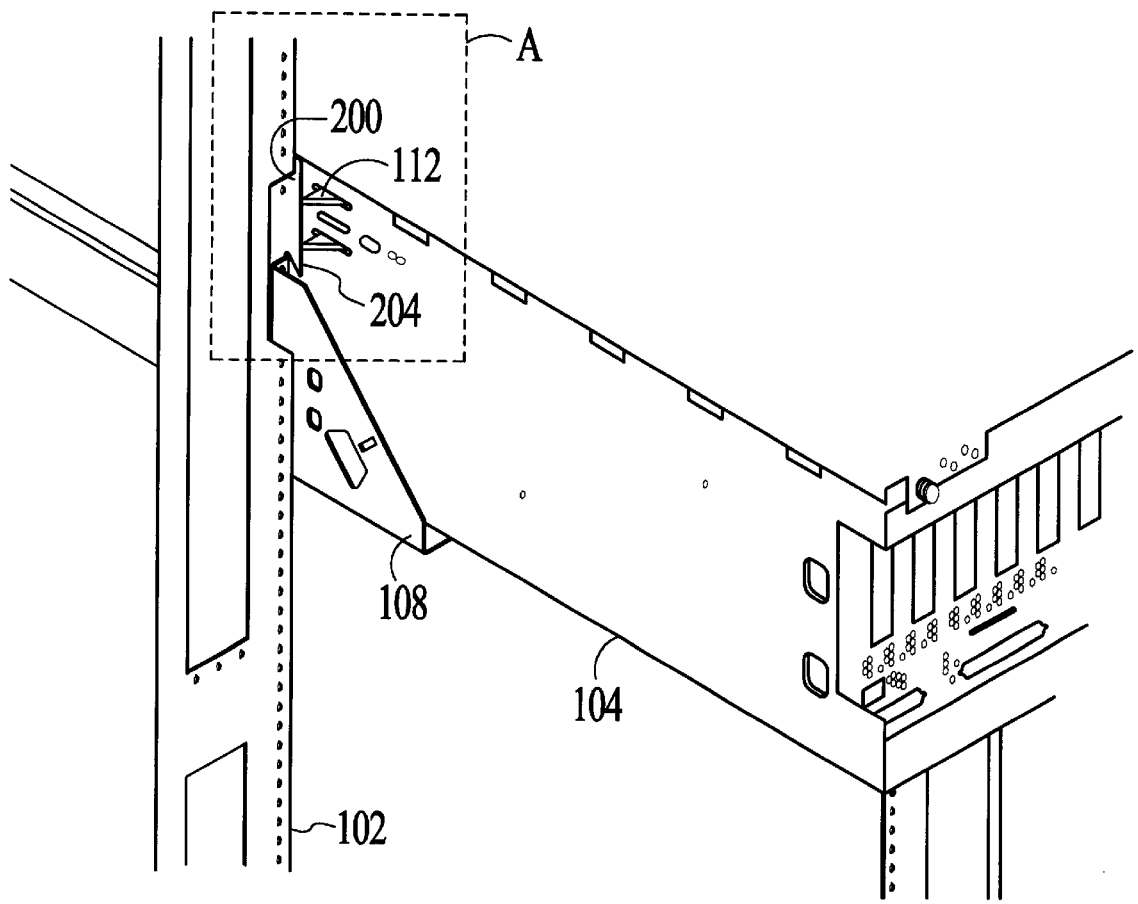
FIG. 5 shows the drawer assembly configuration of FIG. 3 wherein the drawer assembly has been slidably withdrawn.

The second planar portion 204 is designed to extend at a predetermined angle 203 in relation to the first planar portion 202 in order to automatically retract the safety latch of the computer drawer assembly during a slidable operation thereof. For a better understanding, please refer to FIG. 5. FIG. 5 shows the computer drawer assembly configuration of FIG. 3 wherein the drawer assembly 104 has been slidably withdrawn. As can be seen, the front safety latch 112 has been withdrawn past the rack 102. Typically, the safety latch 112 would catch on the rack 102 during a subsequent attempt to slidably maneuver the drawer assembly 104 back to the normal position. However, due to the angle 203 of the second planar portion 204, the subsequent attempt to slidably maneuver the drawer assembly 104 to the normal position creates pressure on the safety latch 112. Consequently, the pressure created by the angle 203 of the second planar portion 204 causes the safety latch 112 to automatically retract and not catch on the rack 102.

Figure 6:
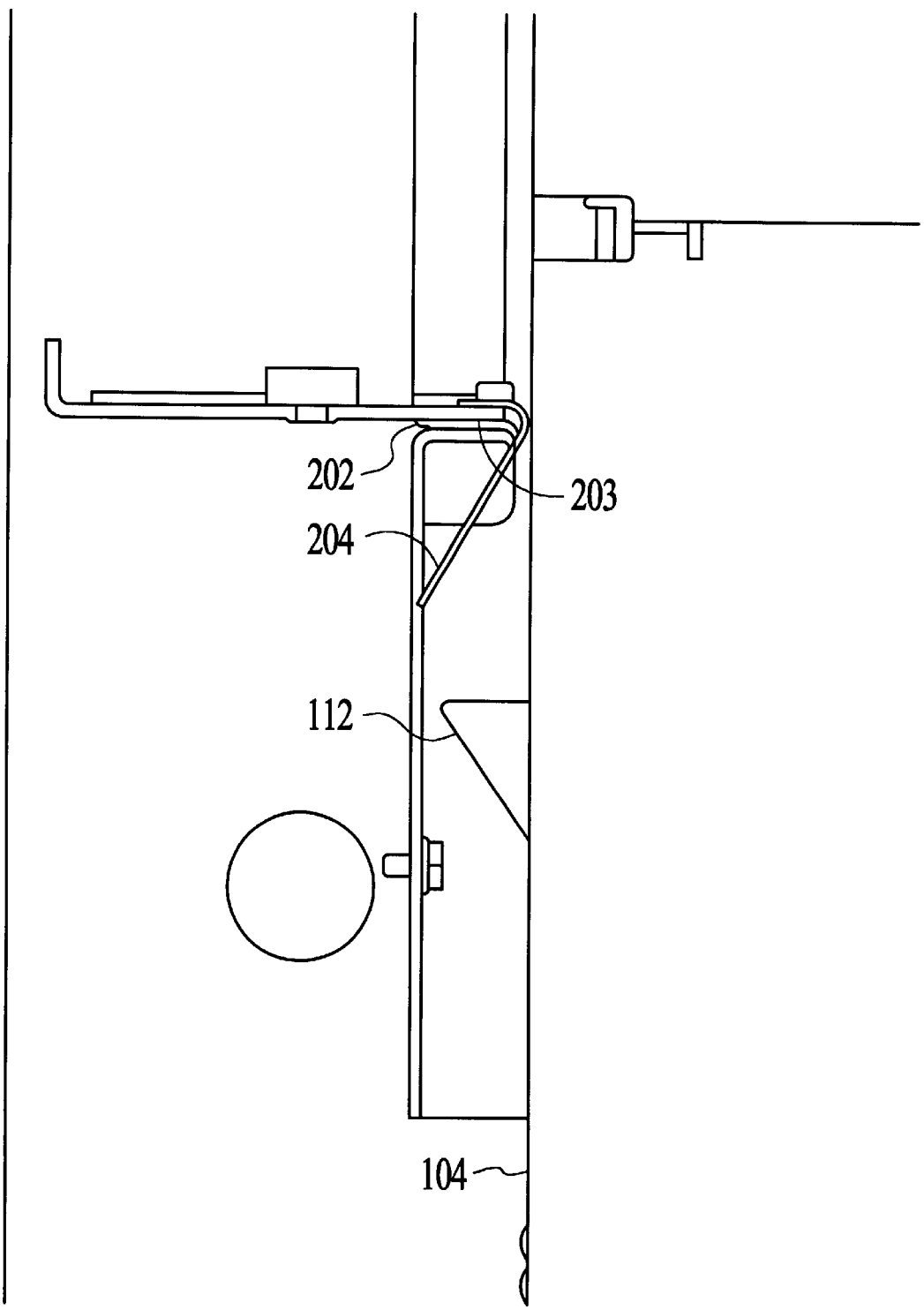
FIG. 6 shows a top view of section A of FIG. 5.

For a further understanding, please refer to FIG. 6. FIG. 6 shows a top view of Section A of the configuration 100. As can be seen, the second planar 204 extends at a predetermined angle 203 relative to the first planar portion 202. Accordingly, when returning the drawer assembly 104 back to the normal position, the safety latch 112 is automatically retracted by the second planar portion 204 of the device in accordance with the present invention. The drawer assembly 104 can therefore be slidably maneuvered back to the normal position without having to manually retract the safety latch 112.

The device in accordance with the present invention eliminates the tedious process of having to physically retract the safety latch with a screwdriver-type tool when using the computer drawer assembly. This adds significant convenience when a system operator needs to slidably maneuver the computer drawer assembly.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A device for use with a computer drawer assembly, the computer drawer assembly including a safety latch, the device comprising:
   a railing portion, wherein the computer drawer assembly is slidably mounted on the railing portion;
   a first planar portion coupled to the railing portion; and
   a second planar portion coupled to the first planar portion at a predetermined angle relative to the first planar portion, wherein the second planar portion causes the safety latch in the computer drawer assembly to automatically retract during the slidable operation of the computer drawer assembly.

2. The device of claim 1, wherein the first planar portion includes at least one opening through which an attachment element is utilized to couple the device to the railing portion.

3. The device of claim 2 wherein the attachment element comprises a threaded screw.

4. A device for use with a computer drawer assembly, the computer drawer assembly including a safety latch, the device comprising:
   a railing portion, wherein the computer drawer assembly is slidably mounted on the railing portion;
   a first planar portion coupled to the railing portion; and
   a second planar portion coupled to the first planar portion at a predetermined angle relative to the first planar portion, wherein the second planar portion causes the safety latch in the computer drawer assembly to automatically retract during the slidable operation of the computer drawer assembly.

5. The device of claim 4 wherein the first planar portion includes at least one opening through which an attachment element is utilized to couple the device to the railing portion.

6. The device of claim 5 wherein the attachment element comprises a threaded screw.

7. A device for use with a computer drawer assembly, the computer drawer assembly including a safety latch, the device comprising:
   a railing portion, wherein the computer drawer assembly is slidably mounted on the railing portion;
   a first planar portion coupled to the railing portion, wherein the first planar portion includes at least one opening through which a threaded screw is utilized to couple the device to the railing portion; and
   a second planar portion coupled to the first planar portion at a predetermined angle relative to the first planar portion, wherein the second planar portion causes the safety latch in the computer drawer assembly to automatically retract during the slidable operation of the computer drawer assembly.

8. A system for holding a drawer assembly, the drawer assembly including a safety latch, the system comprising:
   a railing portion; and
   a device coupled to the railing portion comprising a second planar portion coupled to a first planar portion at a predetermined angle relative to the first planar portion, wherein the second planar portion causes the safety latch to automatically retract during a slidable operation of the drawer assembly, and wherein the first planar portion includes at least one opening through which an attachment element is utilized to couple the device to the railing portion.

9. The system of claim 8, wherein the attachment element comprises a threaded screw.

* * * * *